United States Patent [19]
Ueno et al.

[11] Patent Number: 5,548,254
[45] Date of Patent: Aug. 20, 1996

[54] BALANCED-TO-UNBALANCED TRANSFORMER

[75] Inventors: Yoshiaki Ueno; Haruhiko Hyosu; Takao Sase; Koji Matsushita; Koji Yamashita, all of Kadoma, Japan

[73] Assignee: Matsushita Electric Works, Ltd., Osaka, Japan

[21] Appl. No.: 394,966

[22] Filed: Feb. 27, 1995

[30] Foreign Application Priority Data

Feb. 28, 1994 [JP] Japan ................................ 6-029363

[51] Int. Cl.⁶ ................................................ H03H 7/42
[52] U.S. Cl. ................................ 333/25; 333/32
[58] Field of Search ................................ 333/25, 32

[56] References Cited

U.S. PATENT DOCUMENTS

| | | | |
|---|---|---|---|
| 3,114,120 | 12/1963 | Heck | 333/25 |
| 3,283,311 | 11/1966 | Guttroff | 333/25 X |
| 4,766,402 | 8/1988 | Crane | 333/25 |
| 4,800,344 | 1/1989 | Graham | 333/25 |

*Primary Examiner*—Paul Gensler
*Attorney, Agent, or Firm*—Leydig, Voit & Mayer

[57] ABSTRACT

A balanced-to-unbalanced transformer for interconnecting a balanced signal transmitted on a balanced cable and an unbalanced signal transmitted on an unbalanced cable through a transformer. Common-mode impedance is reduced by grounding a center point of two or more impedance elements between signal lines on the balanced cable side of the transformer to a signal circuit ground or a frame ground on the unbalanced cable side of the transformer.

11 Claims, 8 Drawing Sheets

5,548,254

BALANCED-TO-UNBALANCED TRANSFORMER

BACKGROUND OF THE INVENTION

This invention relates to a balanced-to -unbalanced transformer employed in interconnecting balanced signals and unbalanced signals in information wiring systems.

DESCRIPTION OF RELATED ART

For communication between computers and computer terminal equipment, coaxial cable wiring and the like has been employed. It may be desirable to replace the coaxial cable wiring with unshielded twisted pair cables (UTP). Conventionally, a balance-to-unbalanced transformer (also known as "balun") has been employed for mutual signal interconnection between the unbalanced signal on the coaxial cable (unbalanced cable) and the balanced signal on the twisted pair lines (balanced cable). This balanced-to-unbalanced transformer is effective to restrain a common mode signal voltage which causes any unnecessary electromagnetic radiation of electromagnetic waves. However, because of developments in digital signal transmissions employed in computer communications in recent years, a need has arisen to accommodate increased transmission speeds by ensuring a balanced state over a wide band width. Accordingly, manufacture of the balanced-to-unbalanced transformer has been complicated and more effective measures for controlling noise is required. Further, when pulse signals containing a DC component are transmitted through the balanced cable, in general, the balanced-to-unbalanced transformer user a choke type transformer which has an excellent common mode signal rejection ratio.

According to any known system, however, a common mode ground impedance charcteristic is apt to vary due to the influence of the foregoing transformer on the balanced cable after the installation of the transmission equipment and depending on the conditions under which the system is used. Accordingly, a problem arises in that unnecesary electromagnetic interference or the like occurs due to variations in the ground impedance, or conditions upon connection of the balanced-to-unbalanced transformer to the transmission equipment.

SUMMARY OF THE INVENTION

Accordingly, it is a primary object of the present invention to provide a balanced-to-unbalanced transformer which reduces unnecessary electromagnetic radiation.

In accordance with the present invention, the above object can be realized by means of a balanced-to-unbalanced transformer for mutually interconnecting a balanced signal transmitted on a balanced cable and an unbalanced signal transmitted on an unbalanced cable. First and second impedance elements are connected is series across signal lines of the balanced cable. An electrical center point between the impedance elements is connected to either a signal circuit ground or a frame ground on the side of the unbalanced cable.

In the present invention, it is possible to reduce the common mode impedance by grounding the center point of the impedance element between the signal lines on the balanced side to the circuit ground or frame ground.

In the present invention, further, it is possible to prevent a DC component signal from leaking to the ground by grounding the center point of the impedance elements through a capacitive element e.g., a capacitor, so that the capacitive element reduces the DC component transmitted to the ground.

In the present invention, further, the impedance elements have a high impedance with respect to a characteristic impedance of the balanced cable side signal lines. Accordingly, influence due to changes in the characteristic impedance of the balanced side signal lines can be minimized by the addition of the impedance element. An addition of an impedance matching circuit to the signal lines on the unbalanced cable side, allows matching of the impedance of the balanced-to-unbalanced transformer as seen from the balanced cable side, as well as matching of the impedance of an unbalanced side input of the transformer with the impedance of the terminal equipment. Further, the impedance matching circuit acts as an attenuation circuit for reducing a return loss due to any connected equipment.

Other objects and advantages of the present invention shall be made clear as the description of the invention advances in the following as detailed with reference to preferred embodiments shown in accompanying drawings.

While the invention shall now be described with reference to the embodiments shown in the accompanying drawings, it should be appreciated that the intention is not to limit the invention only to the illustrated embodiments but to include all alterations, modification and equivalent arrangements possible within the scope of appended claims.

DETAILED DESCRIPTION OF THE PREFERRED EMBODIMENTS

Figure 1:
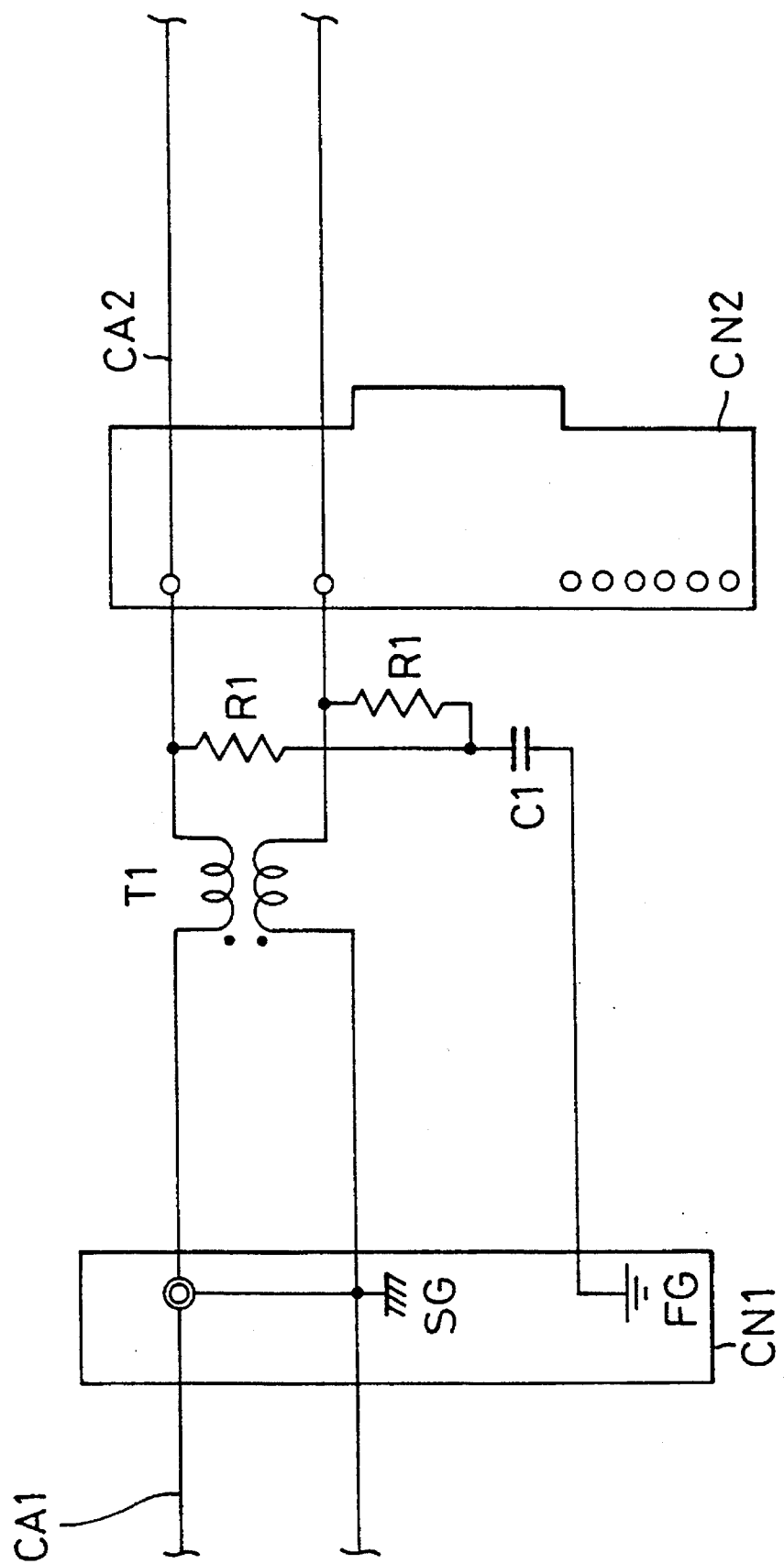
FIG. 1 is a schematic circuit diagram of the balanced-to-unbalanced transformer in an embodiment according to the present invention.
Figure 2:
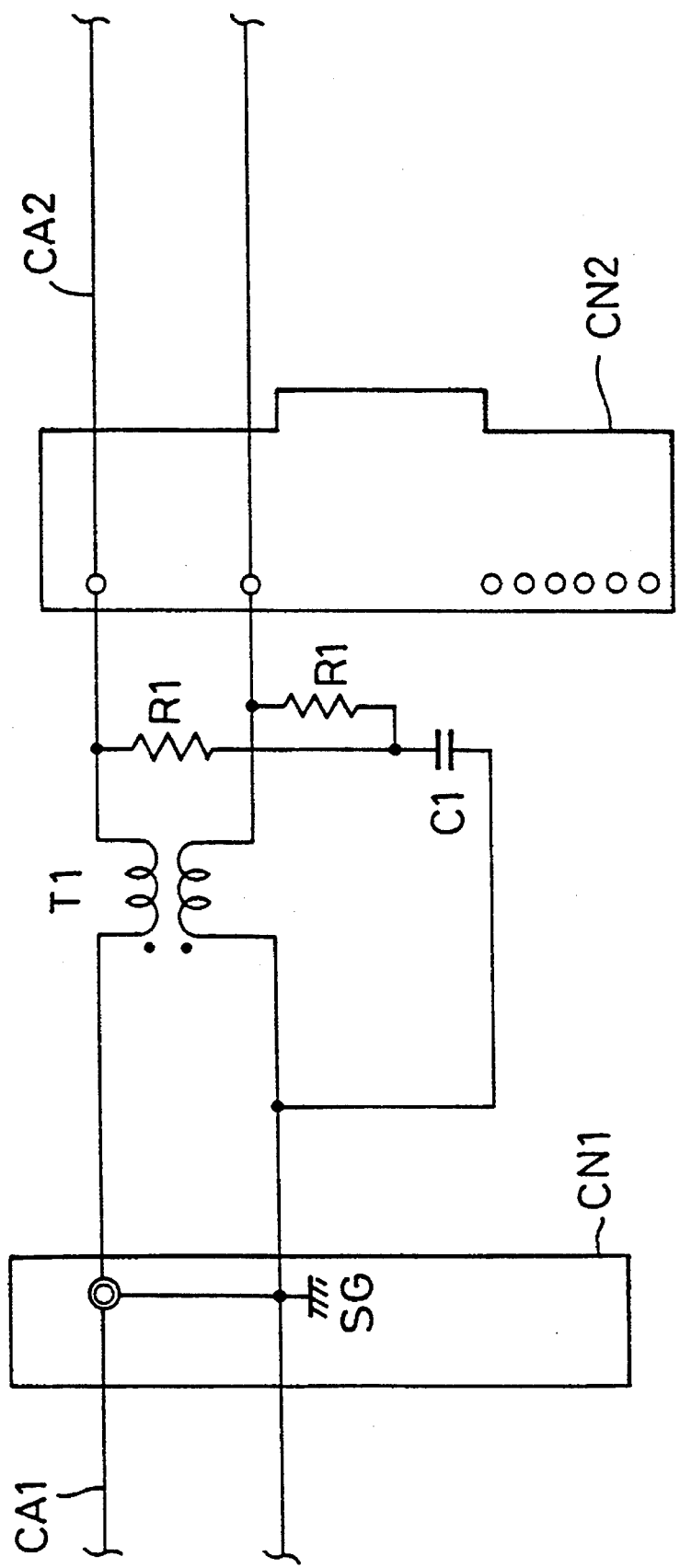
FIG. 2 is a schematic circuit diagram of the transformer in another embodiment according to the present invention.

Referring to the embodiment shown in FIG. 1, the balanced-to-unbalanced transformer includes a choke type transformer T1 connected at one terminal of a primary side winding and one terminal of a secondary side winding, through a connector CN1, to an unbalanced cable CA1, e.g., a coaxial cable, and at the other terminals of both windings, through a connector CN2, to a balanced cable CA2, e.g., twisted pair lines or the like. Here, two resistors R1 are connected across the terminals of the transformer T1 on the balanced cable side, while a center point of these two resistors R1 is connected through a capacitor C1 to a frame ground (grounding) FG. While in the present embodiment the center point is connected through the capacitor C1 to the frame ground (grounding) FG, it may be alternately connected to a ground SG of a signal circuit (e.g., a ground of the unbalanced circuit as shown in FIG. 2). Further, while in the present embodiment the grounding is made through the capacitor C1 as an advantageous measure where a DC component is present in the data signal, the DC component being blocked by the capacitor, it is also possible to ground the center point of the two resistors R1 directly or through any other impedance element in the absence of a DC component.

Figure 3:
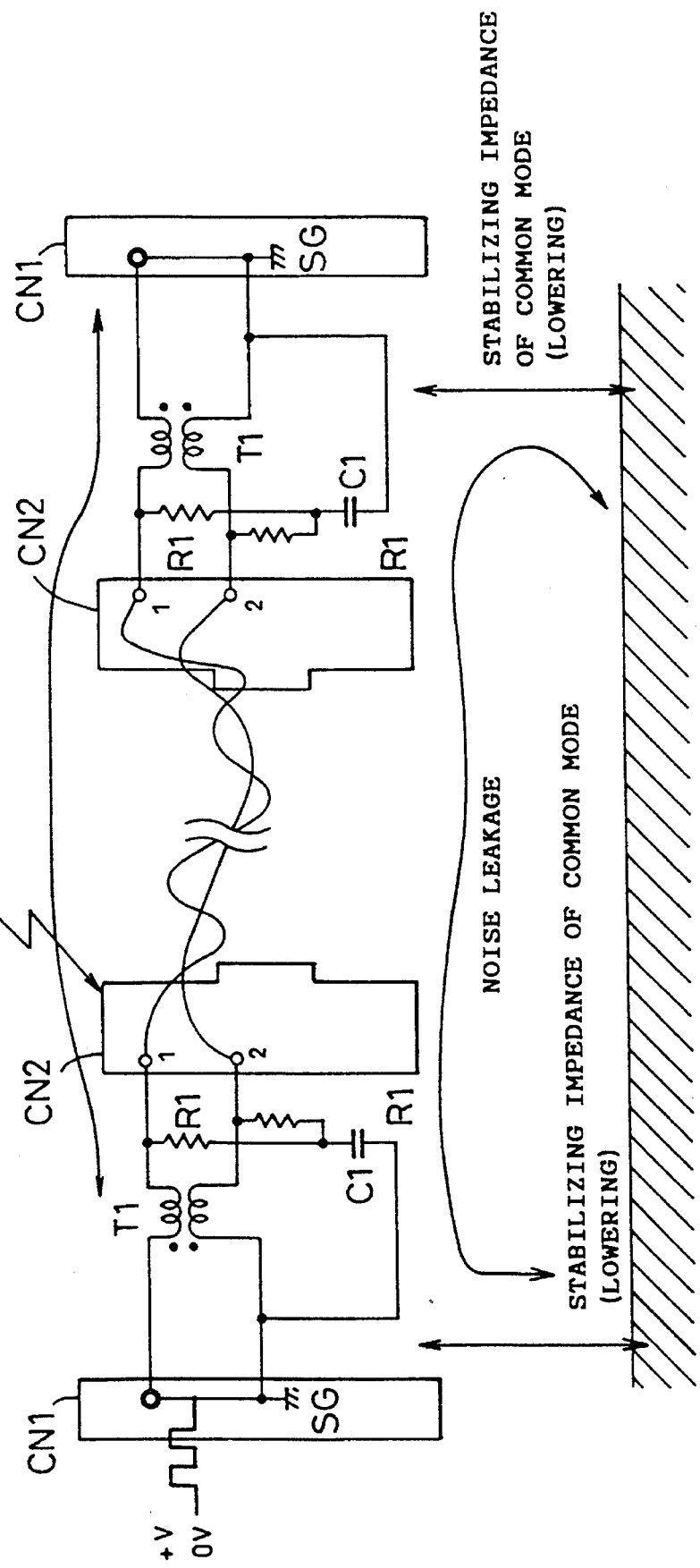
FIG. 3 is an explanatory view for the operation of the respective embodiments shown in FIGS. 1 and 2.

In the present embodiment, the center point of the two resistors R1 is grounded. Accordingly, the common mode ground impedance of the transformer is stabilized at a low level without relying on any external conditions. As shown in FIG. 3, any noise readily flows to the ground. Hence, the noise on the balanced cable side is reduced. Where the grounding occurs through the capacitor C1, a transmission of signals having a DC component is possible since there is no leakage current to ground.

Figure 4A:
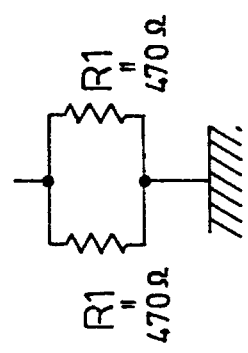
FIGS. 4a and 4b are explanatory views for the feature in the embodiments of FIGS. 1 and 2.
Figure 4B:
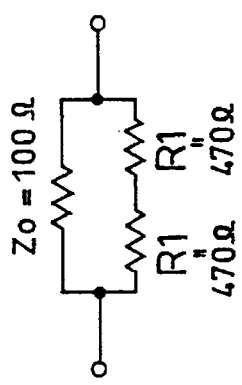

Here, the ground impedance of common mode is determined by a parallel resistance (R1/2) of the two resistors R1 connected to the balanced cable side and an impedance of the capacitor C1 connected to the center point of the resistors. When unshielded twisted pair lines having a characteristic impedance (e.g., $Z_0=100$ Ω) are used as the balanced cable CA2, and the resistance value of the resistors R1 is set to be an impedance higher (e.g., three to five times higher) than the characteristic impedance $Z_0$ (e.g., 470Ω) with the center point of the resistors R1 grounded directly, a balanced series impedance will be about 90.38Ω (as shown in FIG. 4a) and the common mode impedance will be about 235Ω (as shown in FIG. 4b). In this manner, the impedance with respect to the common mode can be reduced without remarkably influencing the balanced series impedance. Even in the case where the center point of the resistors R1 is grounded through the capacitor C1, the impedance of the capacitor C1 at frequencies where noise is present can be kept sufficiently small so that there is no substantial increase in the impedance of the common mode with respect to the frequency of noise by the capacitor C1.

Figure 5:
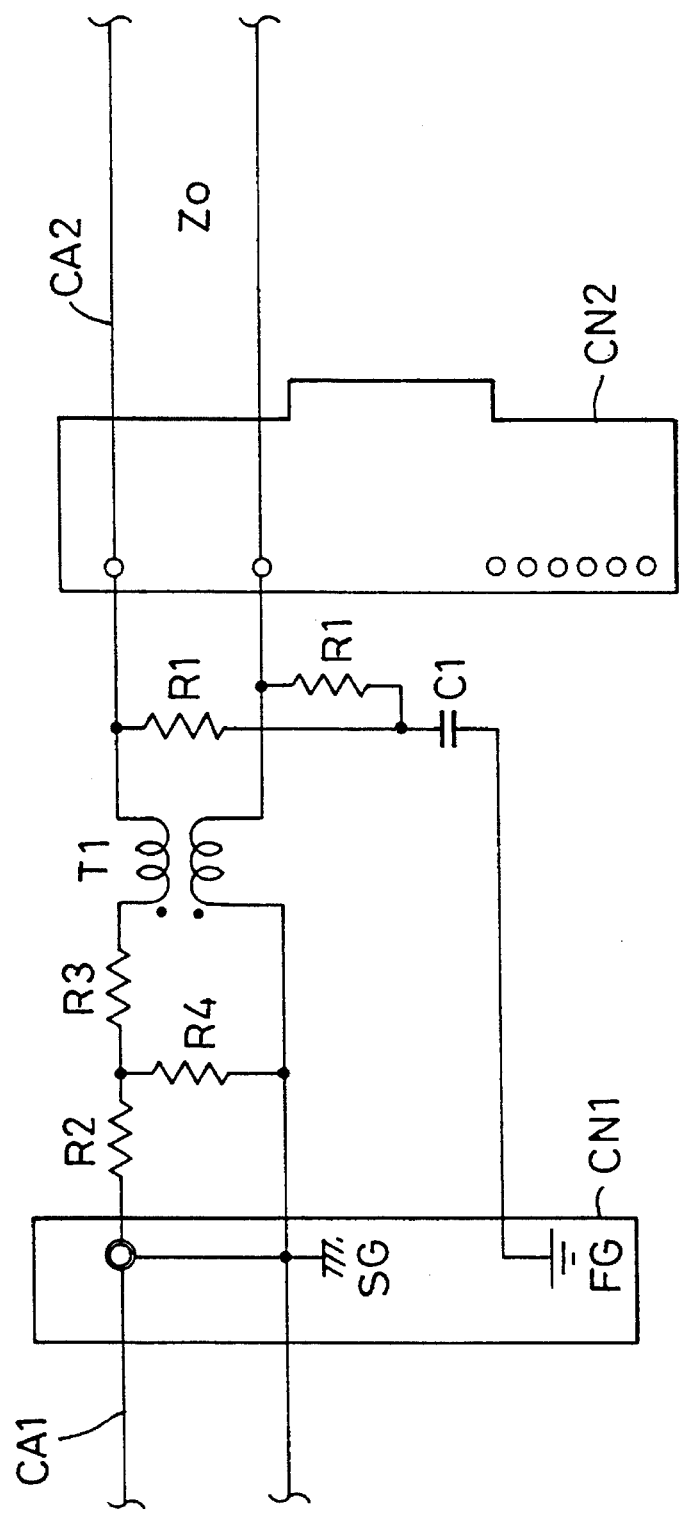
FIGS. 5 to 8 are schematic circuit diagrams of the transformer in further embodiments according to the present invention.

FIG. 5 is a schematic circuit diagram showing the balanced-to-unbalanced transformer in another embodiment of the present invention, in which a resistor circuit comprising resistors R2 to R4 is connected to the unbalanced cable side terminals of the transformer T1 in the circuit shown in FIG. 1. These resistors R2 to R4 match the impedance of the balanced-to-unbalanced transformer as seen from the balanced cable side with the characteristic impedance of the balanced cable as well as a match of the impedance of the unbalanced cable side input of the balanced-to-unbalanced transformer with the impedance of the associated equipment. Resistors R2 to R4 also attenuate any return loss due to the associated equipment. While in the present embodiment the resistors R1 are connected through the capacitor C1 to the frame ground (grounding) FG, it is of course possible to connect them to the ground of the signal circuit (the ground of unbalanced circuit) SG.

Figure 6:
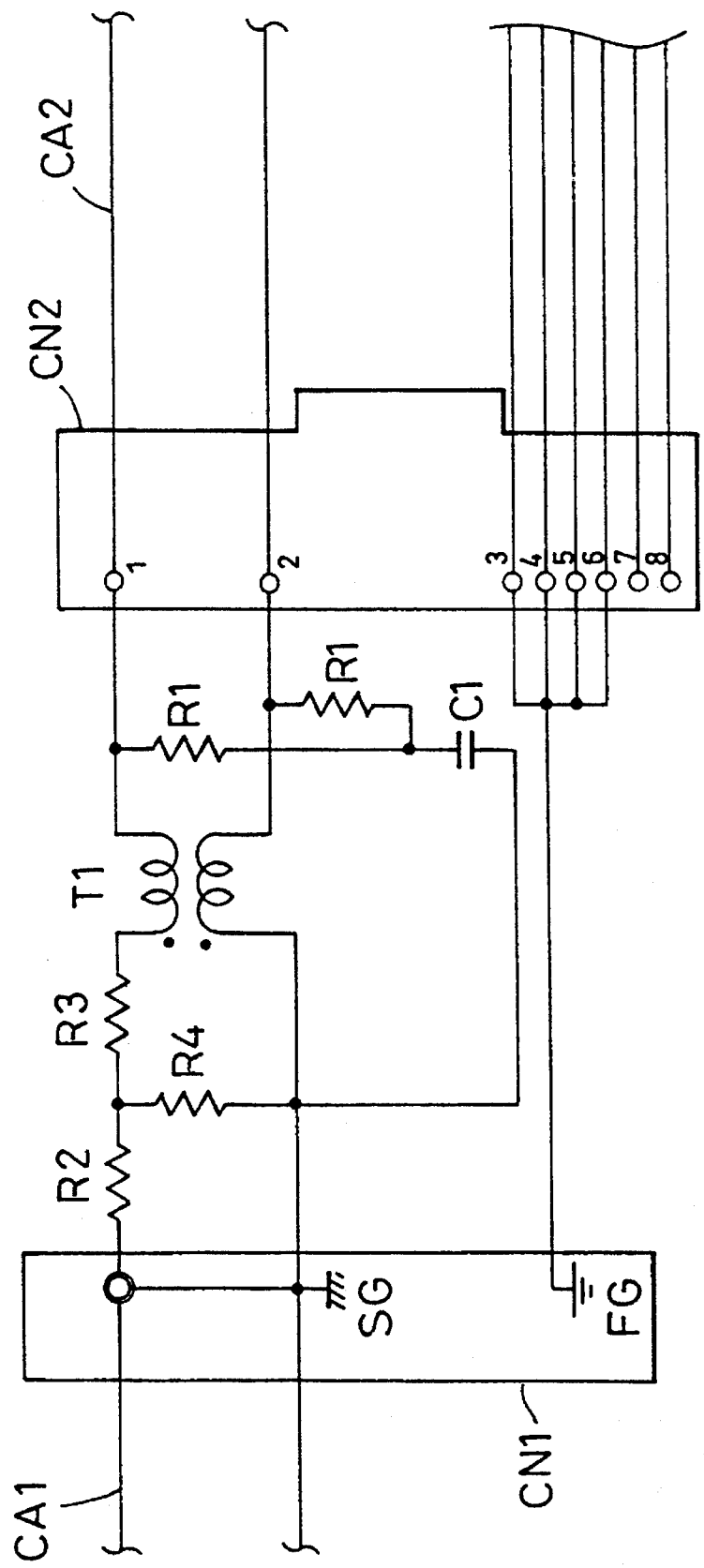
Figure 7:
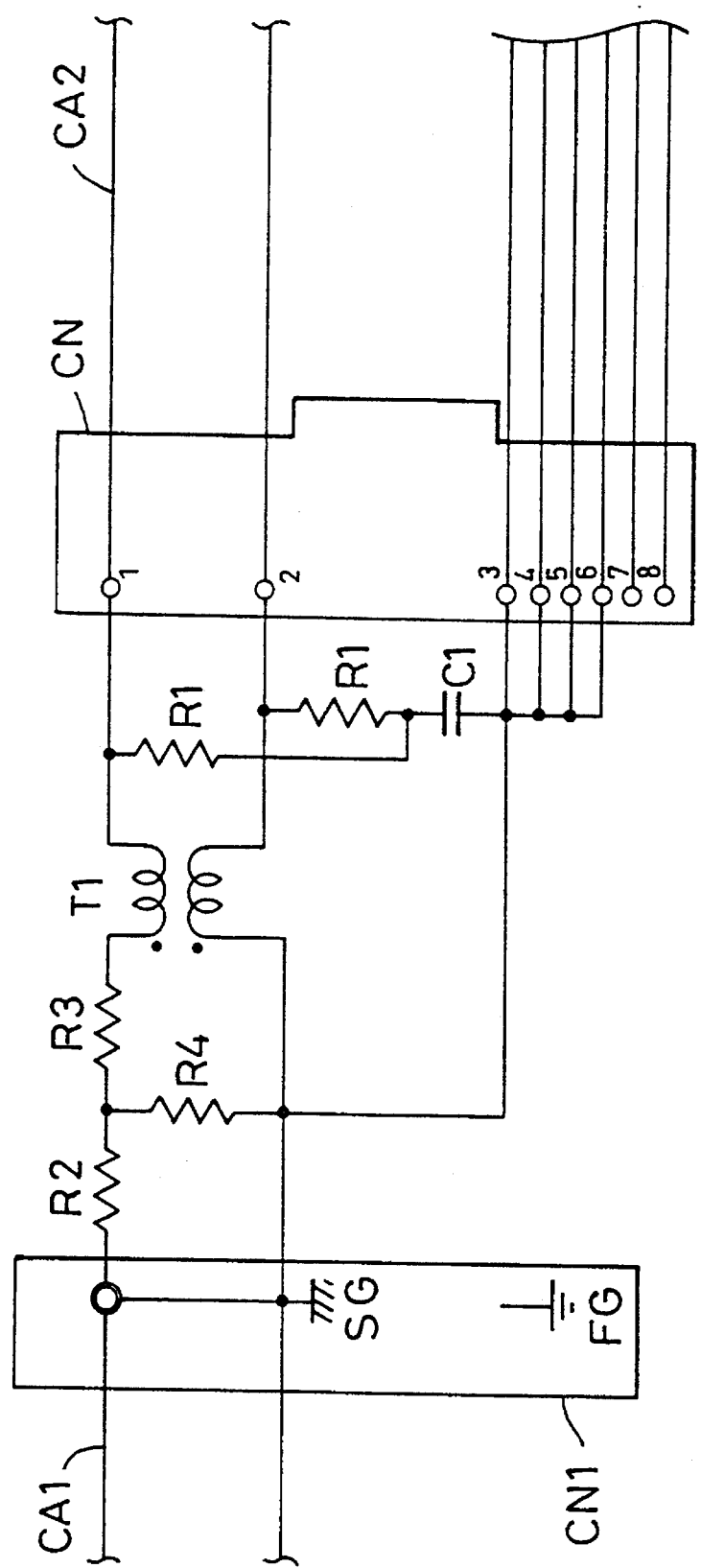
Figure 8:
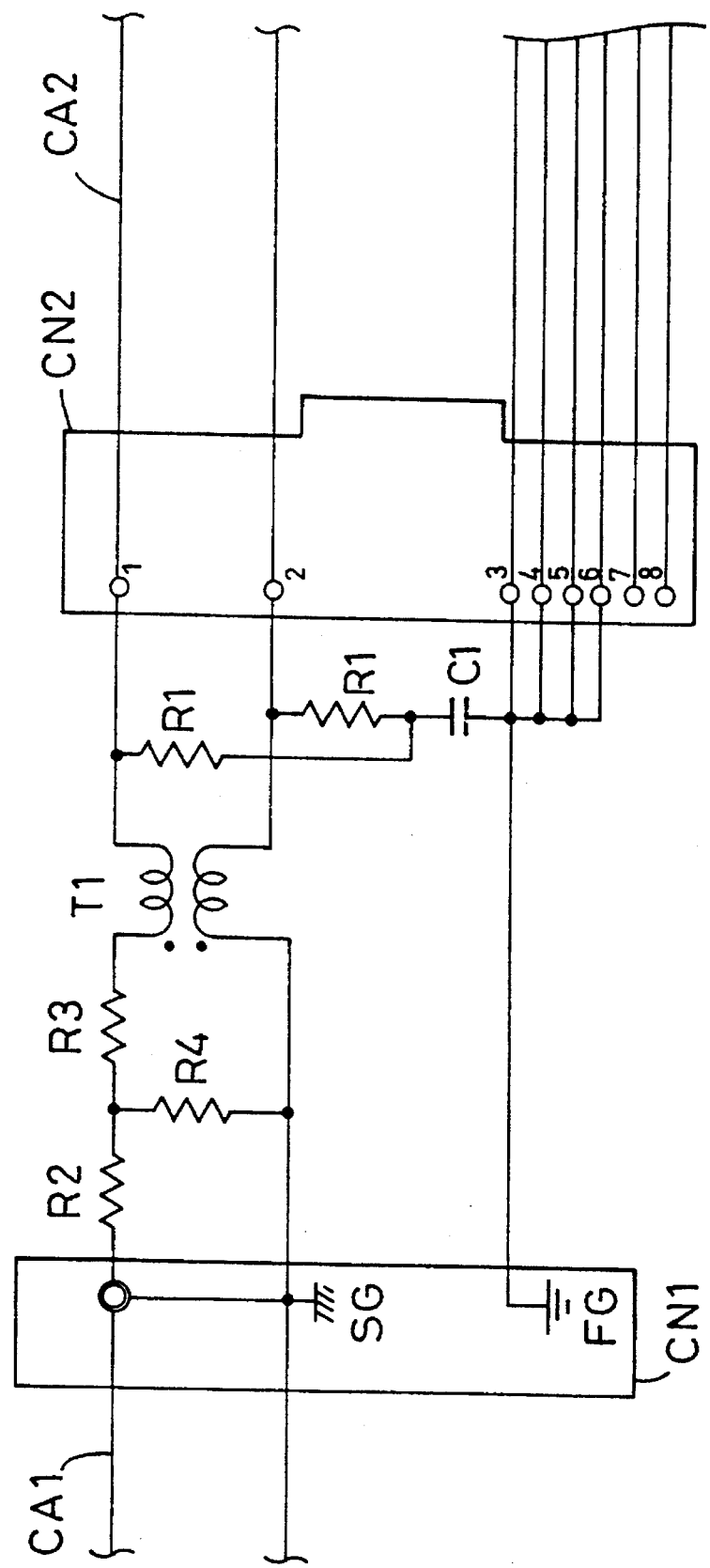

FIGS. 6 to 8 are schematic circuit diagrams showing the balanced-to-unbalanced transformer in further embodiments of the present invention, in which multi-pair cables are used as the balanced cable CA2 and idle lines are grounded. That is, in these embodiments, four pairs of cable lines are employed as the balanced cable CA2, one pair of cable lines connected to terminals 1 and 2 of the connector CN2 are used as the signal lines, while two pairs of cable lines connected to terminals 3 to 6 are connected to the frame ground (grounding) FG or to the ground of the signal circuit (the ground of unbalanced circuit) SG. Further, while in these embodiments the two pairs of the cable lines connected to the terminals 3 to 6 are shown to be grounded, they may be either one pair or three pairs of the cable lines.

Figure 9:
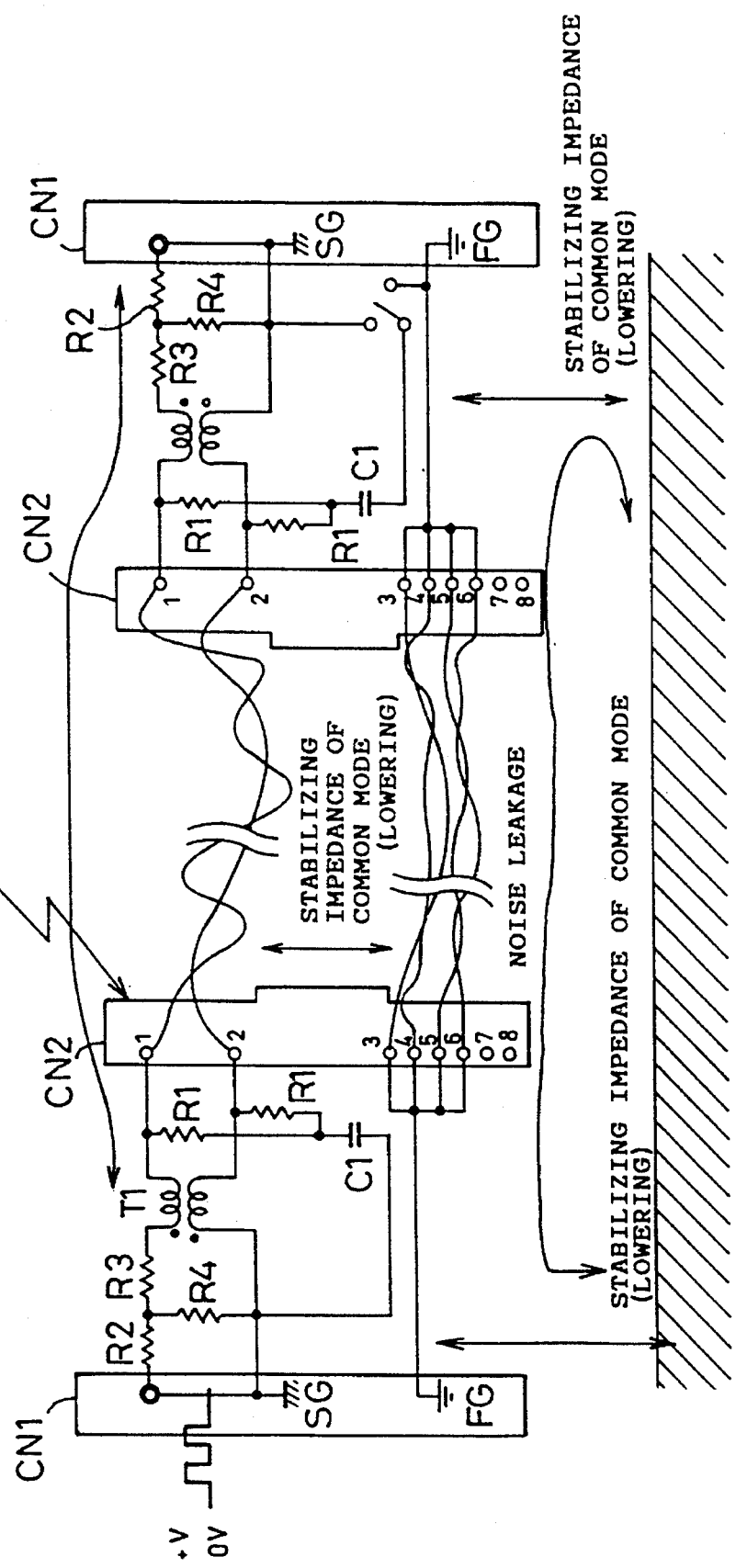
FIG. 9 is an explanatory view for the operation of the respective embodiments shown in FIGS. 5 to 8.

In these embodiments, it is possible to further lower the common mode impedance than in the case of the foregoing embodiments. As shown in FIG. 9, the noise reduction is improved.

In the foregoing arrangements of the balanced-to-unbalanced transformer, unnecessary electromagnetic radiation can be effectively reduced.

In the present invention, further, a variety of design modification are possible within a technical scope of the appended claims.

What is claimed is:

1. A balanced-to-unbalanced transformer circuit comprising:

an unbalanced coaxial cable including a signal line and a signal ground;

a balanced twisted cable having first and second lines twisted at least in a pair;

a transformer having a primary winding with first and second inputs, the first input being coupled to the signal line and the second input being coupled to the first line, and a secondary winding having third and fourth inputs, the third input being coupled to the signal ground and the fourth input being coupled to the second line; and first and second impedance elements coupled in series across the first and second lines and including a center point connecting the first impedance element to the second impedance element, the center point being coupled to the signal ground, whereby mutual signal interconnection may be achieved between a balanced signal transmitted on the balanced twisted pair cable and an unbalanced signal transmitted on the unbalanced coaxial cable including a capacitor connected between the signal ground and the center point for coupling the center point to the signal ground.

2. A balanced-to-unbalanced transformer circuit comprising:

an unbalanced coaxial cable including a signal line and a signal ground;

a balanced twisted cable having first and second lines twisted at least in a pair;

a transformer having a primary winding with first and second inputs, the first input being coupled to the signal line and the second input being coupled to the first line, and a secondary winding having third and fourth inputs, the third input being coupled to the signal ground and the fourth input being coupled to the second line; and first and second impedance elements coupled in series across the first and second lines and including a center point connecting the first impedance element to the second impedance element, the center point being coupled to the signal ground, whereby mutual signal interconnection may be achieved between a balanced signal transmitted on the balanced twisted pair cable and an unbalanced signal transmitted on the unbalanced coaxial cable wherein the balanced twisted pair cable has a characteristic impedance an wherein the first and second impedance elements each have an impedance larger than the characteristic impedance wherein the impedance elements each have an impedance that is between about three and five times the characteristic impedance.

3. A balanced-to-unbalanced transformer circuit comprising:

an unbalanced coaxial cable including a signal line and a signal ground;

a balanced twisted cable having first and second lines twisted at least in a pair;

a transformer having a primary winding with first and second inputs, the first input being coupled to the signal line and the second input being coupled to the first line, and a secondary winding having third and fourth inputs, the third input being coupled to the signal ground and the fourth input being coupled to the second line; and first and second impedance elements coupled in series across the first and second lines and including a center point connecting the first impedance element to the second impedance element, the center point being coupled to the signal ground, whereby mutual signal interconnection may be achieved between a balanced signal transmitted on the balanced twisted pair cable and an unbalanced signal transmitted on the unbalanced coaxial cable wherein the balanced twisted cable includes third and fourth lines, the third and fourth lines being idle and connected to the signal ground.

4. A balanced-to-unbalanced transformer circuit comprising:

an unbalanced coaxial cable including a signal line and a signal ground;

a balanced twisted cable having first and second lines twisted at least in a pair;

a transformer having a primary winding with first and second inputs, the first input being coupled to the signal line and the second input being coupled to the first line, and a secondary winding having third and fourth inputs, the third input being coupled to the signal ground and the fourth input being coupled to the second line; and first and second impedance elements coupled in series across the first and second lines and including a center point connecting the first impedance element to the second impedance element, the center point being coupled to the signal ground, whereby mutual signal interconnection may be achieved between a balanced signal transmitted on the balanced twisted pair cable and an unbalanced signal transmitted on the unbalanced coaxial cable including an unbalanced coaxial cable connector having a frame ground and wherein the balanced twisted pair cable includes third and fourth lines, the third and fourth lines being idle and connected to the frame ground.

5. A balanced-to-unbalanced transformer circuit comprising:

an unbalanced coaxial cable connector including a signal line, a signal ground, and a frame ground;

a balanced twisted cable having first and second lines twisted at least in a pair;

a transformer having a primary winding with first and second inputs, the first input being coupled to the signal line and the second input being coupled to the first line, and a secondary winding having third and fourth inputs, the third input being coupled to the signal ground and the fourth input being coupled to the second line; and first and second impedance elements coupled in series across the first and second lines and including a center point connecting the first impedance to the second impedance element, the center point being coupled to the frame ground, whereby mutual signal interconnection may be achieved between a balanced signal transmitted on the balanced twisted cable and an unbalanced signal transmitted on the unbalanced coaxial cable.

6. The transformer of claim 5 including a capacitor connected between the frame ground and the center point to couple the center point to the frame ground.

7. The transformer of claim 5 wherein the balanced twisted cable has a characteristic impedance and wherein the first and second impedance elements each have an impedance larger than the characteristic impedance.

8. The transformer of claim 7 wherein the impedance elements each have an impedance that is between about three and five times the characteristic impedance.

9. The transformer of claim 5 wherein the balanced twisted cable includes third and fourth lines, the third and fourth lines being idle and connected to the signal ground.

10. The transformer of claim 5 wherein the balanced twisted cable includes third and fourth lines, the third and fourth lines being idle and connected to the frame ground.

11. A balanced-to-unbalanced transformer circuit comprising:

an unbalanced coaxial cable connector including a signal line, a signal ground, and a frame ground;

a balanced twisted cable including first and second lines twisted at least in a pair and third and fourth lines and having a characteristic impedance, the third and fourth lines being idle and connected to the frame ground;

first, second, and third resistors, each having first and second inputs, the first input of the first resistor being connected to the signal line, the second input of the first resistor being connected to the first inputs of the second and third resistors, the second input of the second resistor being connected to the signal ground;

a choke transformer having a primary winding with first and second inputs, the first input of the primary winding being coupled to the second input of the third resistor and the second input of the primary winding being connected to the first line, and a secondary winding having third and fourth inputs, the third input of the secondary winding being connected to the signal ground and the fourth input of the secondary winding being connected to the second line, the third input having the same polarity as the first input;

fourth and fifth resistors, each having first and second inputs and an impedance of between three and five times the characteristic impedance, the first inputs of the fourth and fifth resistors being connected together at a center point, the second input of the fourth resistor being connected to the first line and the second input of the fifth resistor being connected to the second line; and a capacitor connected between the center point and the frame ground, whereby mutual signal interconnection may be achieved between a balanced signal transmitted on the balanced twisted cable and an unbalanced signal transmitted on the unbalanced coaxial cable.

* * * * *

UNITED STATES PATENT AND TRADEMARK OFFICE
CERTIFICATE OF CORRECTION

PATENT NO. : 5,548,254
DATED : August 20, 1996
INVENTOR(S) : Ueno et al.

It is certified that error appears in the above-indentified patent and that said Letters Patent is hereby corrected as shown below:

Column 4, Line 58, change "an" to --and--.

Signed and Sealed this

Thirty-first Day of December, 1996

Attest:

BRUCE LEHMAN

*Attesting Officer*  *Commissioner of Patents and Trademarks*